United States Patent
Thomsen (10) Patent No.: US 11,888,390 B2
(45) Date of Patent: Jan. 30, 2024

(54) SYSTEM FOR OPERATING PFC ELEMENTS IN AN INTERLEAVED MANNER

(71) Applicant: Secop GmbH, Flensburg (DE)

(72) Inventor: Rune Thomsen, Logumkloster (DK)

(73) Assignee: Secop GmbH, Flensburg (DE)

( * ) Notice: Subject to any disclaimer, the term of this patent is extended or adjusted under 35 U.S.C. 154(b) by 300 days.

(21) Appl. No.: 17/284,726

(22) PCT Filed: Oct. 14, 2019

(86) PCT No.: PCT/EP2019/077825
§ 371 (c)(1),
(2) Date: Apr. 12, 2021

(87) PCT Pub. No.: WO2020/078929
PCT Pub. Date: Apr. 23, 2020

(65) Prior Publication Data
US 2021/0320586 A1 Oct. 14, 2021

(30) Foreign Application Priority Data
Oct. 15, 2018 (EP) .................... 18200488

(51) Int. Cl.
*H02M 1/42* (2007.01)
*H03L 7/091* (2006.01)

(52) U.S. Cl.
CPC .......... *H02M 1/4225* (2013.01); *H03L 7/091* (2013.01)

(58) Field of Classification Search
CPC ............................. H02M 1/4225; H03L 7/091
See application file for complete search history.

(56) References Cited

U.S. PATENT DOCUMENTS

| | | |
|---|---|---|
| 7,884,588 B2 | 2/2011 | Adragna et al. |
| 8,098,505 B1 | 1/2012 | Choi |
| 8,493,754 B1 | 7/2013 | Wambsganss et al. |
| 2009/0257257 A1 | 10/2009 | Adragna et al. |
| 2009/0257258 A1 | 10/2009 | Ayukawa et al. |

(Continued)

FOREIGN PATENT DOCUMENTS

| | | |
|---|---|---|
| CN | 101652917 A | 2/2010 |
| CN | 102307007 A | 1/2012 |

(Continued)

OTHER PUBLICATIONS

PCT International Search Report and Written Opinion, Application No. PCT/EP2019/077825, dated Nov. 5, 2019, 12 pages.

(Continued)

*Primary Examiner* — Rafael O De Leon Domenech
(74) *Attorney, Agent, or Firm* — Mahamedi IP Law LLP (57) ABSTRACT

The invention relates to a system for operating a first PEG element (PFC1) and a second PEC element (PFC2) in an interleaved mariner, said system comprising a first integrated circuit (IC1) having a first PFC controller, a second integrated circuit (IC2) having a second PFC controller, as well as a synchronization circuit (SYNC) connecting the first integrated circuit (IC1) and the second integrated circuit (IC2), whereas the synchronisation circuit (SYNC) is adapted to control the first integrated circuit (IC1) and the second integrated circuit (IC2) such that the first PFC element (PFC1) and the second PFC element (PFC2) are operated in anti-phase.

11 Claims, 8 Drawing Sheets

(56) References Cited

U.S. PATENT DOCUMENTS

2011/0149622 A1 6/2011 Lin
2012/0008351 A1* 1/2012 Yonezawa ........... H02M 1/4225
363/13
2014/0097818 A1 4/2014 Wiktor et al.

FOREIGN PATENT DOCUMENTS

| CN | 202218171 U | 5/2012 |
| CN | 108111011 A | 6/2018 |
| WO | 2008085091 A1 | 7/2008 |

OTHER PUBLICATIONS

European Patent Office, Extended European Search Report, Application No. 18200488.7, dated Apr. 4, 2019, 7 pages.
China National Intellectual Property Admininstration, Office Action, CN Application No. 201980068197.3, dated Jul. 21, 2023, 8 pages.

* cited by examiner

$V_i < \tfrac{1}{2} V_o$:

SYSTEM FOR OPERATING PFC ELEMENTS IN AN INTERLEAVED MANNER

FIELD OF THE INVENTION

The invention relates to a system for operating a first PFC element and a second PFC element in an interleaved manner, according to claim 1.

STATE OF THE ART

In order to minimize losses and avoid the need of extra power requirements to run an application, many active power factor correction topologies have been introduced. Depending on the power density level that an application has to handle, two main approaches can be employed:
- a single-stage power factor corrector (PFC) for low power density;
- a multiple-stage power factor corrector, often referred to as "interleaved" for high power density;

The interleaved concept is used to split up the total power density in separate PFC components and it can be realized by employing two or more single-stage power factor correctors (PFCs) which usually are connected in parallel. The more stages are added, the more complex the control regulation logic becomes.

Normally, one control integrated circuit (IC) is used in order to handle the overall control strategy of the interleaved power factor converter, but compared to the single stage solution, this control IC is more complex and more expensive (complex control IC).

OBJECTIVE OF THE INVENTION

It is therefore an object of the present invention to facilitate interleaved functionality, without having to rely on the usually employed complex control IC.

It is desired to achieve full interleaved functionality by using only single-stage power factor correction control ICs.

PRESENTATION OF THE INVENTION

An object of the invention is achieved by means of a system for operating a first PFC element and a second PFC element in an interleaved manner, said system comprising
- a first integrated circuit having a first single-stage PFC controller,
- a second integrated circuit having a second single-stage PFC controller, as well as
- a synchronization circuit connecting the first integrated circuit and the second integrated circuit, whereas the synchronisation circuit is adapted to control the first integrated circuit and the second integrated circuit such that the first PFC element and the second PFC element are operated in anti-phase.

The first integrated circuit having a first single-stage PFC controller controls the first PFC element, the second integrated circuit having a second single-stage PFC controller controls the second PFC element.

Thus, in accordance with the invention, it is possible to use the usual, single-stage power factor correction (PFC) control integrated circuit (IC), in order to achieve full interleaved functionality. Due to the synchronization circuit, the need for employment of complex control ICs becomes moot, since interleaved functionality may be achieved through simple and inexpensive, single-stage PFC control ICs, i.e. the first integrated circuit for the first PFC element and the second integrated circuit for the second PFC element.

According to a preferred embodiment of the system, said system is realized as a symmetric phase locked loop.

Thus, the first PFC element and the second PFC element become part of a symmetric phase locked control loop, which enables these two individual single-stage PFC elements to work together in interleaved manner all the way from low to high power and from zero crossing to mains peak.

According to a preferred embodiment of the system, the synchronisation circuit is adapted to use a signal provided by the first integrated circuit and/or a signal provided by the second integrated circuit as a master for the symmetric phase locked loop.

Therefore, it is possible to have the first integrated circuit (slave) phase locked to the signal provided by the second integrated circuit (master), or to have the second integrated circuit (slave) phase locked to the signal provided by the first integrated circuit (master). In either case, the slave would have to adjust its frequency to be in anti-phase with the master.

However, for symmetry reasons it is preferable if both stages, i.e. the signal provided by the first integrated circuit and the signal provided by the second integrated circuit, act as both, master and slave. Thus, each signal is controlled by its phase relation to each other. With such a symmetric setup all offset effects in the control part will be cancelled by the same amount of offset in the other part.

Therefore, according to a preferred embodiment of the system, the synchronisation circuit is adapted to control the signal provided by the first integrated circuit on the basis of its phase relation to the signal provided by the second integrated circuit, and vice versa.

According to yet another preferred embodiment of the system, the synchronisation circuit comprises a phase detector adapted to generate output signals in dependence on a phase relation between a signal provided by the first integrated circuit and a signal provided by the second integrated circuit, and whereas said output signals are sent to the first integrated circuit and/or to the second integrated circuit.

Said phase detector compares both incoming signals, with respect to their phase relation, and generates output signals on the basis of this comparison. These output signals are subsequently fed back to the first and/or second integrated circuit enabling to adjust the operation of the respective PFC element to which the IC is assigned. Thereby, the interleaved functionality may be optimised.

According to a preferred embodiment of the system, the phase detector is realised as a flip-flop, which is provided with a gate signal of a transistor of the first integrated circuit, as well as with a gate signal of a transistor of the second integrated circuit, and whereas a first output signal of the flip-flop is sent to an error amplifier of the first integrated circuit, and a second output signal of the flip-flop is sent to an error amplifier of the second integrated circuit.

This is a particular simple realisation of the synchronisation circuit according to the invention. This control topology enables interleaved functionality of the associated PFC elements.

In order to keep the design of the synchronisation circuit as simple as possible, according to a preferred embodiment of the system, the flip-flop is made of two NPN transistors with cross-coupled resistor feedback from collectors of one transistor to the base of the respective opposite transistor.

According to yet another preferred embodiment of the system, the output signals of the phase detector, preferably the first output signal and the second output signal of the flip-flop, are guided across at least one low-pass filter of the synchronisation circuit.

Said low-pass filter may comprise a capacitor and a resistance, and it averages the response of the phase detector, i.e. its output signal, before they are fed to the first and/or second integrated circuit.

According to a preferred embodiment of the system, the system further comprises a balance circuit adapted to match an output voltage of the error amplifier of the first integrated circuit with an output voltage of the error amplifier of the second integrated circuit.

Thereby, the error amplifiers can be forced to have approximately the same output voltage, which improves the overall stability of the control loop.

According to a preferred embodiment of the system, the balance circuit is part of the synchronisation circuit.

If the balance circuit is integrated into the synchronisation circuit, the design of the synchronisation circuit according to the invention can be kept simple. This is particularly advantageous when the synchronisation circuit itself is realised as an integrated circuit.

According to a preferred embodiment of the system, the balance circuit is made of two PNP transistors having common emitters coupled as a simple differential amplifier.

According to another preferred embodiment of the system, the first integrated circuit and the second integrated circuit are adapted to apply direct current control and each contains a voltage error amplifier.

Alternatively, according to another aspect of the invention, the first integrated circuit and the second integrated circuit are adapted to apply indirect current control and each contains a transconductance amplifier as an error amplifier.

An object of the present invention may also be achieved by a system for operating a first PFC element and a second PFC element in an interleaved manner, said system comprising
- a first PFC controller,
- a second PFC controller, as well as
- a synchronization circuit connecting the first PFC controller and the second PFC controller, whereas the synchronisation circuit is adapted to control the first PFC controller and the second PFC controller such that the first PFC element and the second PFC element are operated in anti-phase, whereas said system is realised as a single integrated circuit having drive output ports for the first PFC element and for the second PFC element.

According to a preferred embodiment of this system, either the first PFC controller or the second PFC controller has an error amplifier. Thus, no balance circuit is required in such a system.

BRIEF DESCRIPTION OF THE FIGURES

It follows a brief description of the invention using figures of exemplary embodiments.

FIG. 13b resembles the operation mode of the system of FIG. 13a

WAYS OF CARRYING OUT THE INVENTION

Problem Description

The Power Factor of an AC variable speed drive electronic is defined as the ratio of the real power, flowing to the load, to the apparent power in the system. A power factor of less than one means that the voltage and current waveforms are not in phase, causing some losses and extra power requirements to run the application.

In order to achieve an ideal power factor around 1, many active power factor correction topologies have been studied and introduced.

Depending on the power density level that the electronics has to handle, two main approaches can be used:
- a single stage power factor corrector for low power density;
- a multiple stage power factor corrector, called "interleaved", for high power density;

In particular, the interleaved concept, used in order to split the power density on components, can be realized by using two or more power factor correction stages. As more stages are added, the more complex the control regulation logic becomes.

In variable speed drives, e.g. for compressors for cooling appliances, the electronic board concept is often modularized, meaning the same electronic platform can be used for 115V and 230V marketed segments.

Comparing the 115V platform towards the 230V platform, the input current will be the double when driving the same load. This means that, in order to reduce power density, an interleaved power factor (double stage) concept would be preferred for 115V application, and single stage concept for 230V application To achieve modularization, normally an Integrated Circuit (IC) would be used for both 115V and 230V, which IC is capable to drive an interleave solution. This would give the right cost for the 115V version but an extra cost for the 230V, where the more expensive IC would in principle not be needed and brings no real benefit. In fact, a simpler low cost single stage control IC, could be used in 230V version, but this approach would on the other end compromise the modularity of the solution.

Figure 12:
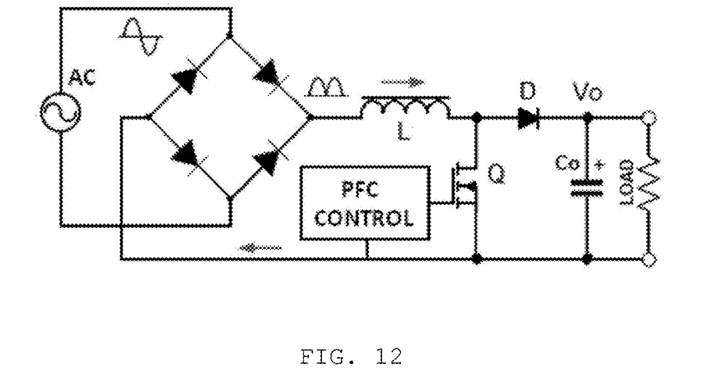
FIG. 12 shows an example of single-stage power factor correction

Single stage power factor correction is normally achieved using the configuration depicted in FIG. 12. A single control IC is used in order to handle the overall control strategy of the power factor converter. For this purpose, different control strategies are currently used. Well known concepts are Continuous Conduction Mode (CCM) or Discountinuous Conduction Mode (DCM) of operation.

Figure 13A:
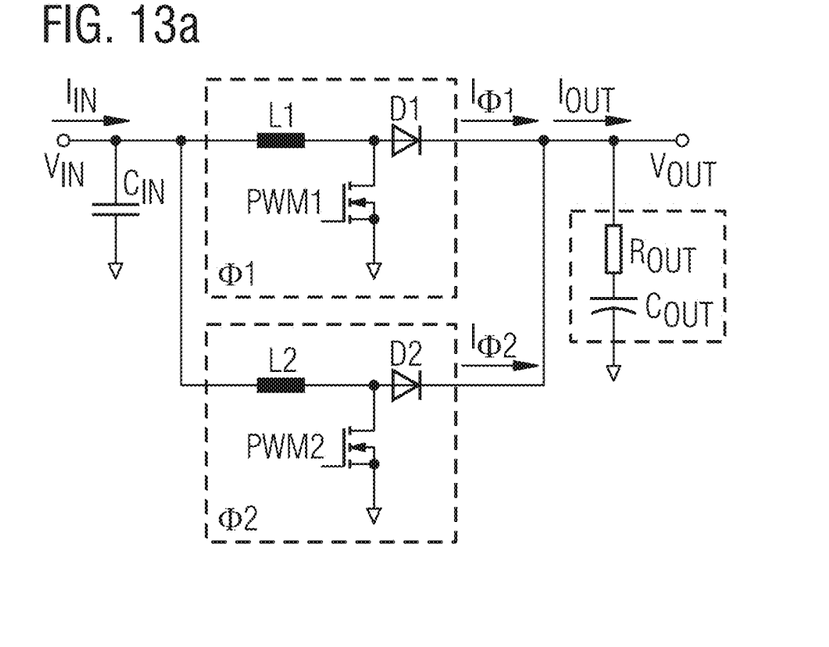
FIG. 13a shows an example of interleaved power factor correction

Interleaved power factor correction is normally used when dealing with higher power application and it is achieved using the configuration shown in FIG. 13a.

Normally, one control IC is used in order to handle the overall control strategy of the interleaved power factor converter. Compared to the single stage solution, this IC is more complex and more expensive.

Figure 13B:
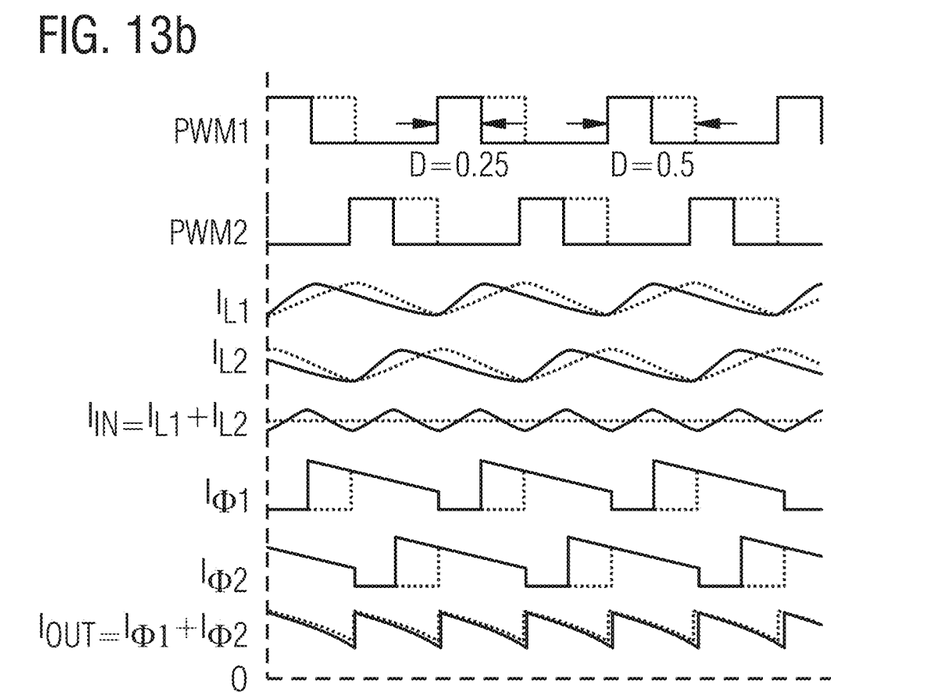

The reason for using more complex control IC is that the two power factor stages need to run interleaved, meaning that the two branches work synchronized out of phase opposition as illustrated by PWM1 & PWM2 signals in FIG. 13b, which resembles the operation mode of the system of FIG. 13a.

Purpose of the Invention

The purpose of the invention is to use two single stage power factor correction control ICs, thereby controlling/synchronizing the ICs such that the power factor correction works with full interleaved functionality.

Figure 14:
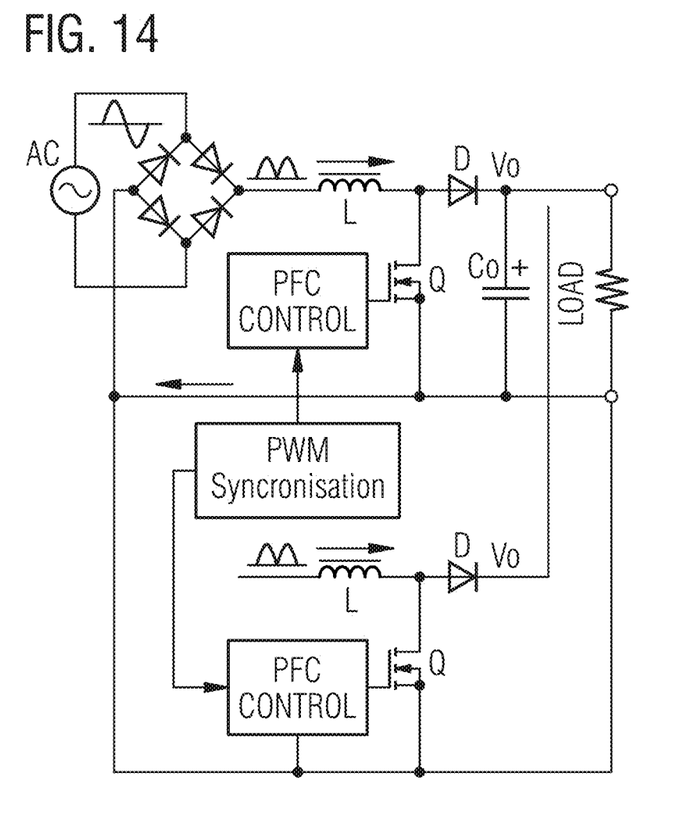
FIG. 14 shows the concept of the system according to the invention

The new design is based on the diagram shown in FIG. 14.

As soon as the AC supply voltage is connected, the synchronization circuit ("PWM Synchronization", SYNC) detects, and provides synchronization of the two power factor correction circuits, i.e. to the first IC, IC1, and the second IC, IC2. This is done continuously for one half periods.

The synchronization signals are provided in order to obtain interleaved functionality, and thereby obtaining interleaved functionality. By doing this it is possible to mount single/dual simple, cost optimized ICs, respectively for the 230V/115V version.

In this way the modularization concept is fully exploited at the same time keeping the cost and complexity exactly tailored to the power demand on the single/dual stage solution.

Brief Description of the Boundary Mode Boost PFC

Figure 1:
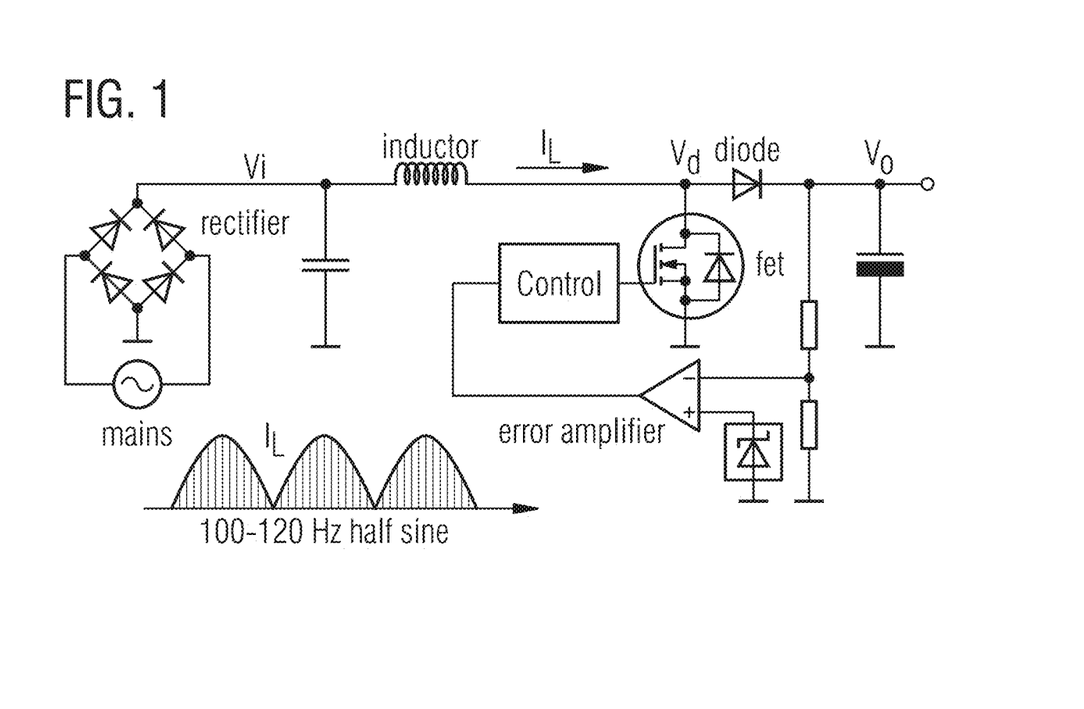
FIG. 1 shows basic power factor control in boundary mode

In the boundary mode boost Power Factor Controller the inductor current is always moving on the boundary between discontinuous and continuous current mode. This working state is often called boundary mode. The FET (field-effect transistor) switch is turned on each time the inductor current reaches zero. The FET switch is turned off again each time the inductor current (=FET current) reaches a pre-defined value which depends on the transferred power multiplied with instantaneous rectified mains voltage. This operation scheme is illustrated in FIG. 1.

Figure 2:
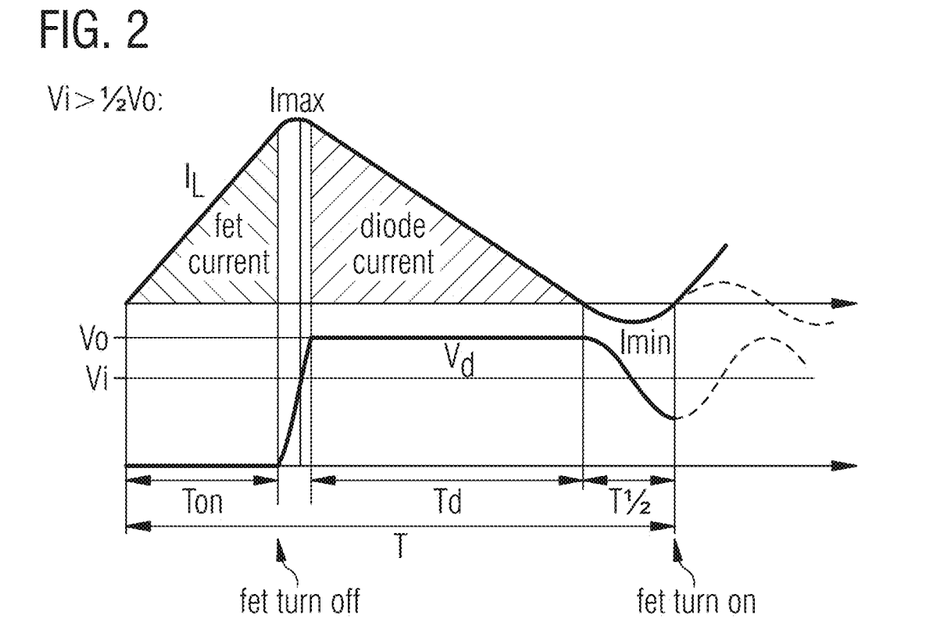
FIG. 2 shows currents and voltage with instantaneous input voltage, $V_i$, greater than ½ of the output voltage, $V_o$
Figure 3:
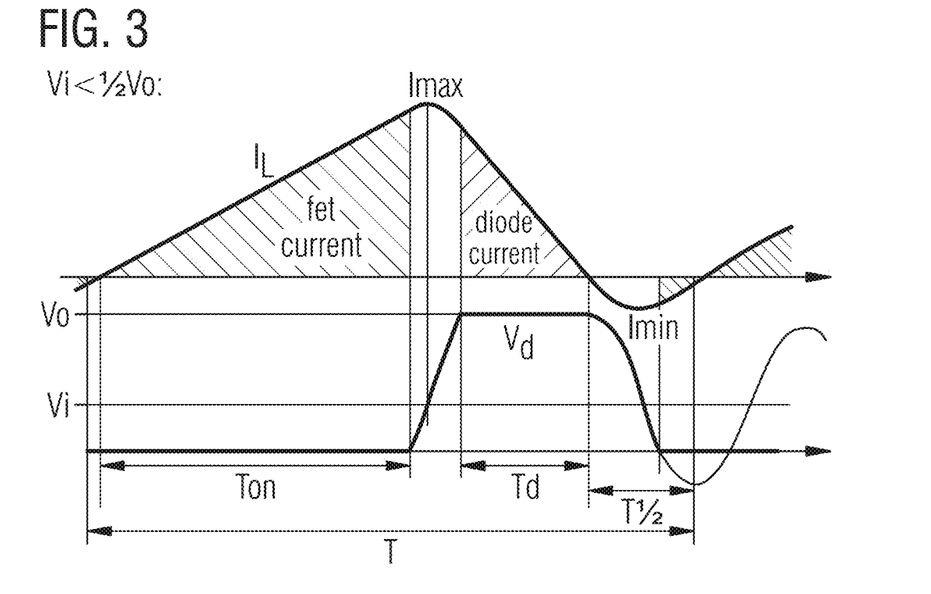
FIG. 3 shows currents and voltage with instantaneous input voltage, $V_i$, less than ½ of the output voltage, $V_o$

The boundary mode PFC has two dominating modes of operation, one when instantaneous input voltage Vi>½ Vo and one when Vi<½ Vo. They are illustrated in FIGS. 2 and 3, in which one high frequency switching cycle is shown. During a mains half cycle the converter will normally run through both operation modes. Imax is the variable top value of IL in FIG. 1.

At mains peek Imax is highest. When approaching mains zero crossings Imax goes towards zero. It can be shown that for constant power and input rms (root mean square) voltage, the FET's on-time is approximately constant during one mains half cycle (if one neglects the voltage rise time and the back-swing time T½). On the other hand, the diode conduction time varies strongly during a mains half cycle.

Thus the switching frequency of the boundary mode boost stage is variable, both as a function of power and during each mains half cycle.

Some Types of Boundary Mode PFC

Several control ICs for boundary mode PFC exist. Many of them operate according to one of the following schemes.

Figure 4:
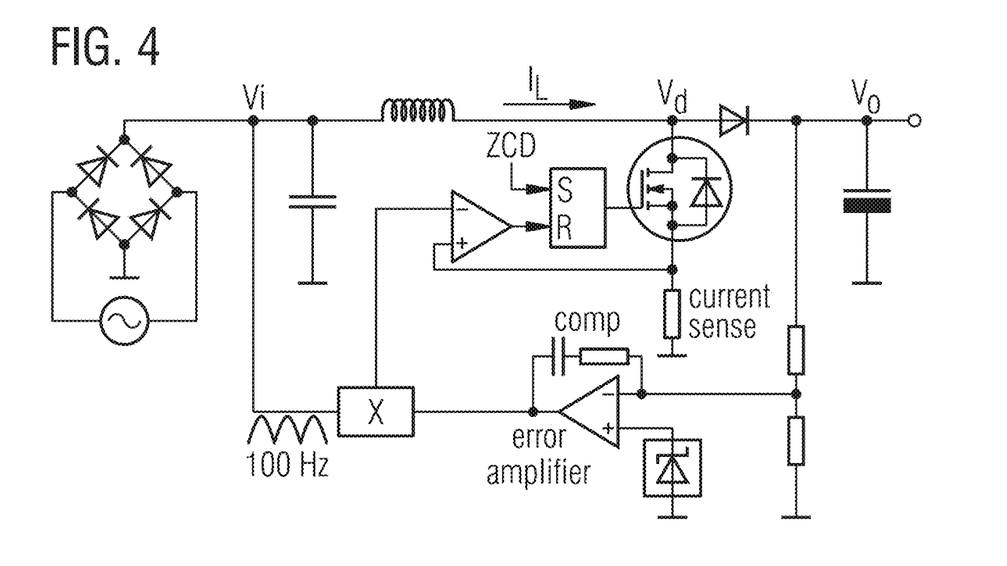
FIG. 4 shows boundary mode PFC with direct current control and voltage error amplifier

In FIG. 4 the peak current is regulated proportional with the 'sin'-shaped input voltage multiplied by the error amplifier output voltage. The error amplifier is a voltage amplifier with a local feedback network (comp) from output to minus-input.

Figure 5:
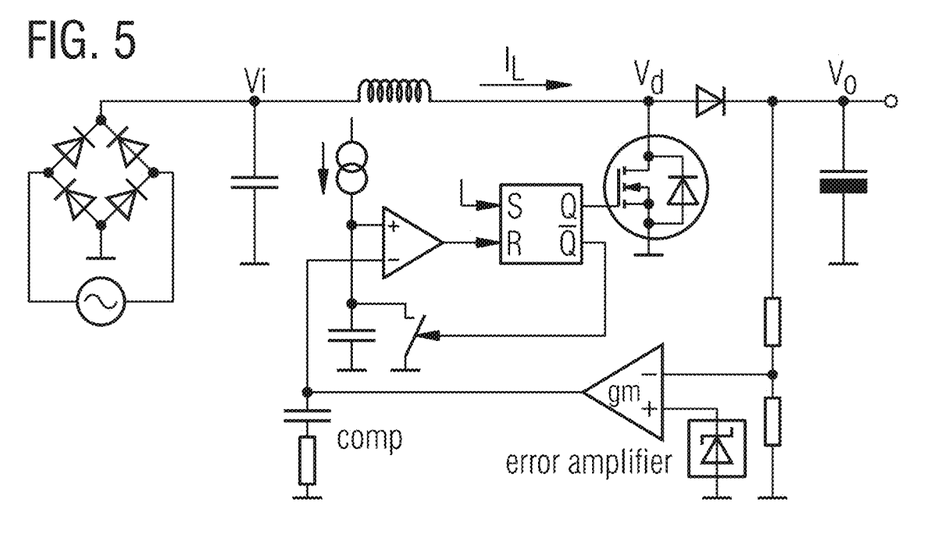
FIG. 5 shows boundary mode PFC indirect current control and transconductance error amplifier FIG. 6 currents and voltages with perfect interleaving

In FIG. 5 there is no direct peak current regulation. Instead, the on-time of the FET is held (more or less) constant during a half mains cycle, however the on-time is regulated versus power. The on-time is determined by charging a capacitor with a constant current, generating a ramp voltage. The height and length of this ramp determines peak current indirectly. This length depends on the voltage from the error amplifier.

In FIG. 5 the error amplifier is a transconductance amplifier which has the compensation network connected between output and ground.

The amplifier type is, however, not coupled to the control method as suggested by the figures. The transconductance amplifier could as well be used with direct current control and vice versa.

For both control methods the FET is usually turned on in the first "valley" (i.e. T½) after the end of diode current. Turning on in the valley is a way to minimize switching losses. This event is called Zero Current Detection (ZCD). The compensation networks are shown with one resistor and one capacitor, but they can contain less or more than that.

The circuit in FIG. 5 usually also contains a resistor for current sensing, but that is for overload protection only, not for regulation. Therefore it is not shown here.

Interleaving Two Boundary Mode PFCs

At high power it can be desirable to share the power between two parallel stages, each handling only half of the power. They must be synchronised to run at the same (variable) frequency, otherwise mutual disturbance and beat frequency effects are likely to occur.

Once having shared the power in two parallel paths, it is now very attractive to lock the two boost converters to always operate in anti-phase. This will cancel all odd harmonics (1, 3, 5, . . . ) of the input and output ripple current, reduce rms currents tremendously, and therefore cause less stress on capacitors and make noise filtering easier.

Anti-phase drive must be built into the control circuit. This is not straight forward, because of the variable frequency. There is no oscillator in either of the two control circuits—or in fact each booster, including the power stage, can be considered its own variable-frequency oscillator, where frequency and power are partly related.

Figure 6:
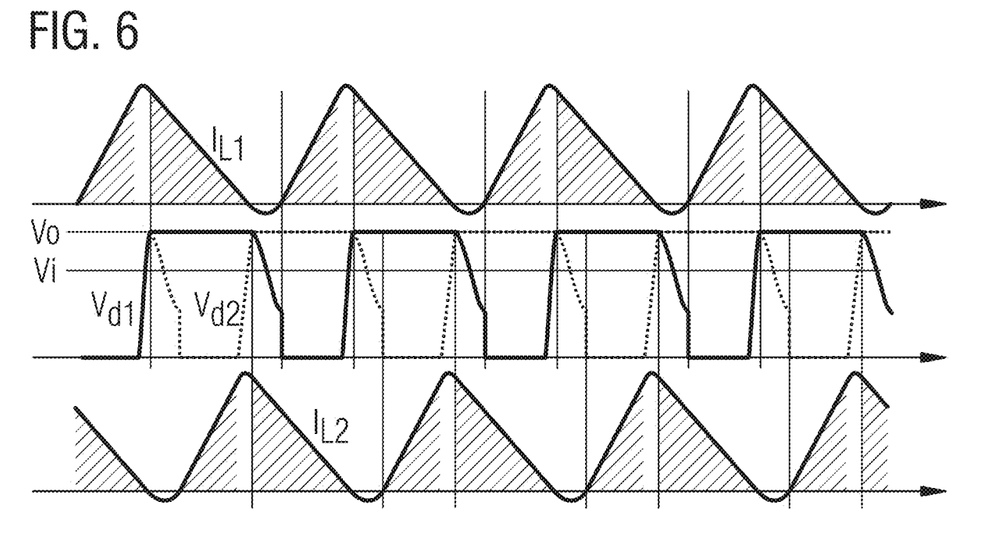

FIG. 6 shows a snapshot of a perfectly interleaved booster pair not so far from the peak of mains voltage. The waveforms in the middle in solid blue and dotted green are the switching voltages of each individual stage.

Now, how can one make two individual PFC stages work together like this all the way from low to high power and from zero crossing to mains peak? One way is to make them be part of a symmetric Phase Looked Loop (PLL). A PLL is a negative feedback loop, where the usual rules for stability and loop compensation apply.

A conventional PLL comprises a phase detector which generates a DC voltage dependent on the phase relation between two signals at the same frequency. Typically, these signals are an in-coming frequency and a local controllable oscillator frequency. This voltage is used to adjust the oscillator frequency, so that both frequency and phase of the oscillator signal coincides with the in-coming signal. The oscillator is phase-locked to the incoming signal.

One could consider one PFC booster a master and the other one a slave. The slave would then have to adjust its frequency to be in anti-phase with the master. But for symmetry reasons it seems smarter to let both stages be both master and slave so that each one is controlled by its phase relation to the other. With a symmetric setup all offset effects in the control part will be cancelled by the same amount of offset in the other part.

Figure 7:
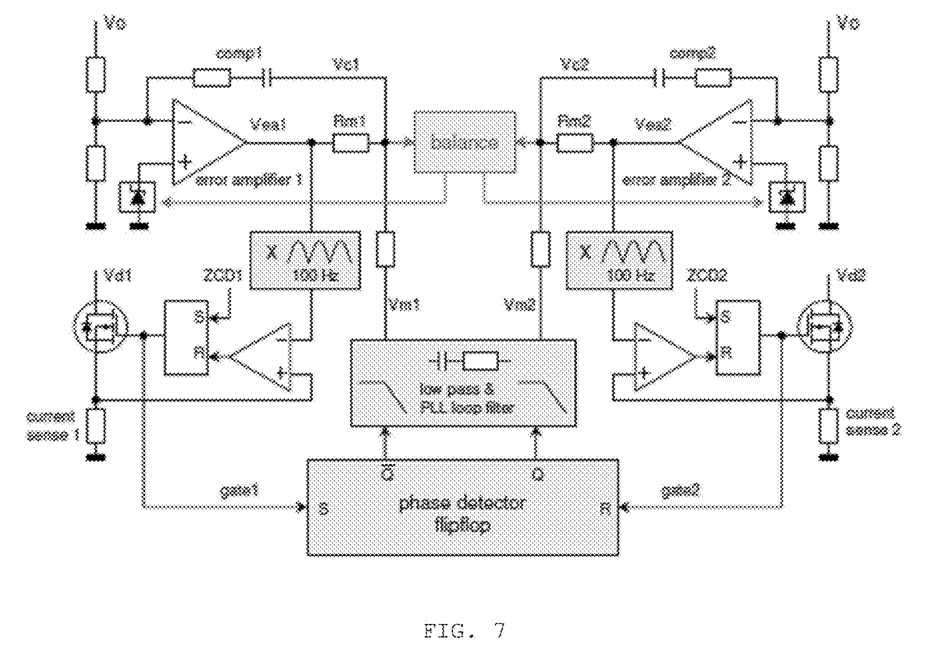
FIG. 7 shows direct current control, voltage error amplifiers
Figure 8:
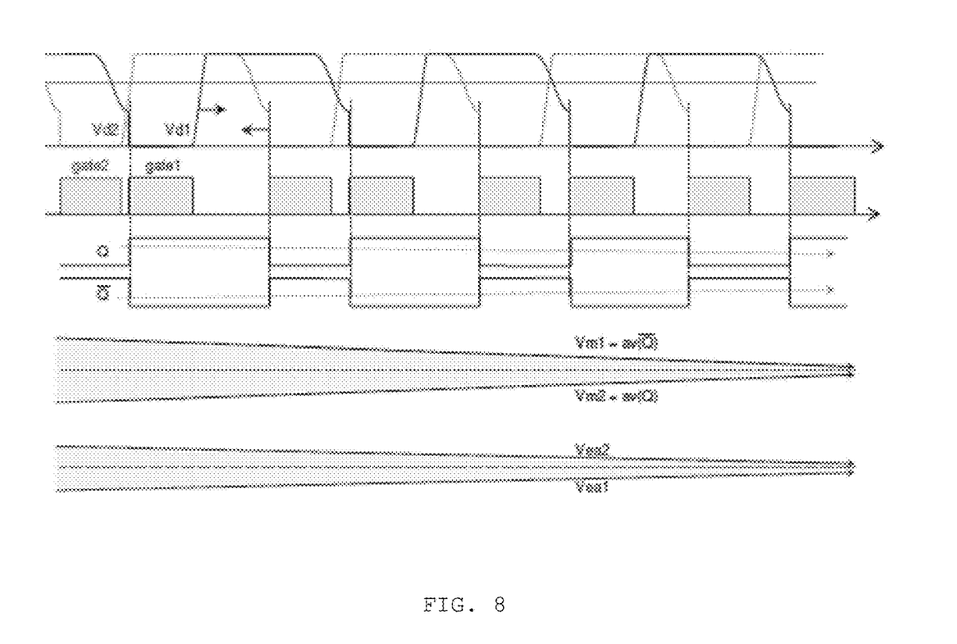
FIG. 8 shows settling of the PLL after disturbance

FIG. 7 shows such a system, phase locking two individual PFC stages, and FIG. 8 illustrates a possible operation mode. This example is using direct current control and a voltage error amplifier.

It is essential to understand that adjusting frequency of a boundary mode converter is identical to adjusting its power and its peak current. One could also adjust the dead time after diode conduction and keep the peak current unchanged. However, this would counteract our wish to minimise switching losses by turning on in the voltage valley.

So frequency adjustment is done by adjusting peak current. In case of an unbalance, the phase detector will try to push one peak current higher and the other peak current lower. An unbalance could for instance be two inductors of slightly different value. The lower inductor will have higher current slope, dI/dt, and since the two converters must run at the same frequency when phase locked, the converter with a lower inductor will run with a slightly higher peek current. This will of course jeopardise the balance, but not much, and rms currents etc. will still be much more favourable than with no interleaving.

FIG. 8 shows the progress towards steady state interleaving after the balance has been disturbed. The phase detector gives two balanced responses to a phase error. These responses are averaged by the low pass filters and are fed to the peak current controllers with a signal that will increase frequency (decrease peak current) of the part with a lagging phase and opposite for the other part.

If Vm1>Vm2 this will influence the error amplifiers oppositely, so that Vea1<Vea2 as shown in FIG. 8. This is caused by the balance circuit and the feedback networks comp1+comp2 which will hold Vc1=Vc2. At steady state, 0 and 0 'not' will both have 50% duty cycle.

The true purpose of the balance circuit is to force the two individual amplifiers to have approximately the same output voltage, which is done by influencing the reference voltage or the voltage divider for each amplifier. This must compensate for offset differences and resistor tolerances. Without a balance circuit Vea1 and Vea2 would diverge due to offset errors and the near infinite amplifier DC gain.

Figure 9:
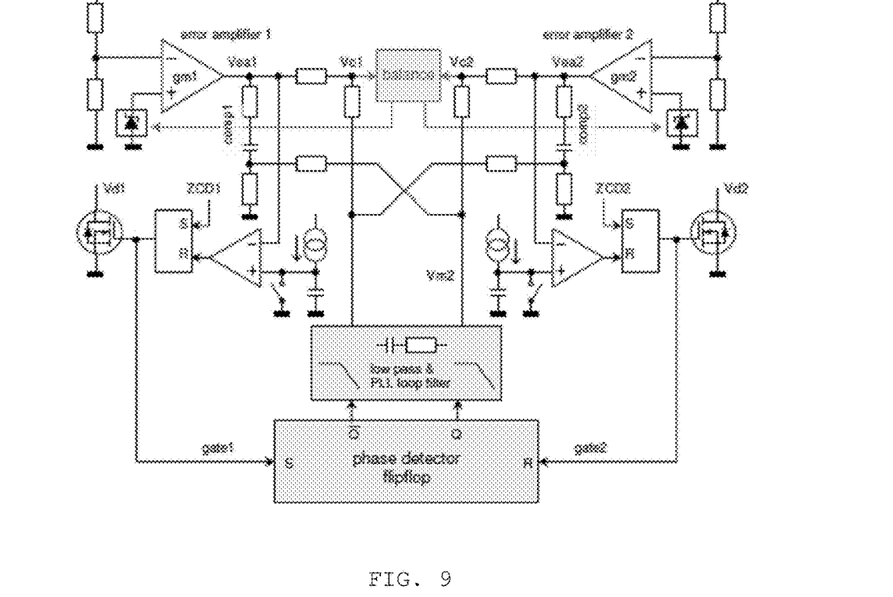
FIG. 9 shows indirect current control, transconductance amplifier, embodiment 1
Figure 10:
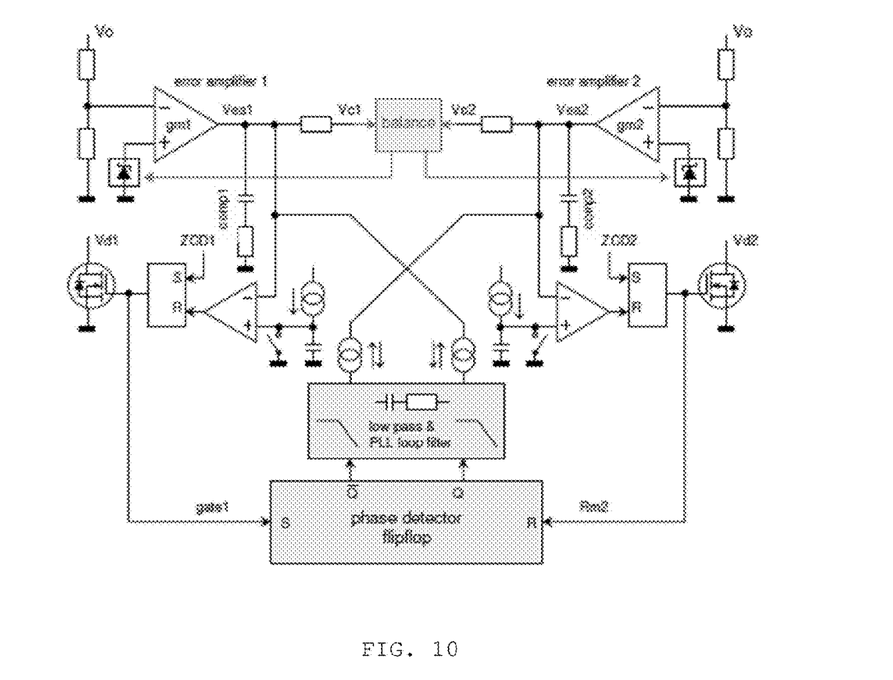
FIG. 10 shows indirect current control, transconductance amplifier, embodiment 2

If one wants to phase lock two stages with indirect current control and transconductance amplifiers, it could be done according to FIG. 9 or 10. The circuit in FIG. 9 uses injection of the phase detector's output signals via resistors. The circuit in FIG. 10 looks simpler and uses bi-directional current sources to generate the outputs of the phase detector. This idea would appeal to be built into an IC.

Figure 11:
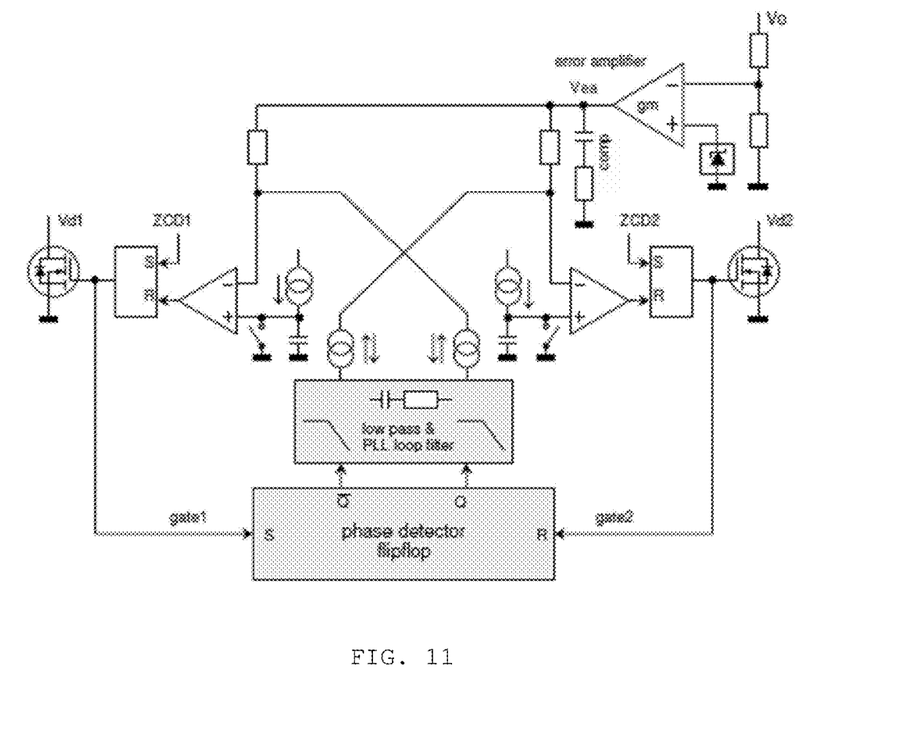
FIG. 11 shows common transconductance error amplifier, indirect current control

The PLL idea can also be built into one control IC having drive outputs for both PFC stages. In that case it will be better to have only one error amplifier, making the balance circuit unnecessary. It might look like in FIG. 11 for a boundary mode PFC with indirect current control and a transconductance amplifier.

For all the ideas shown, the function blocks can be built from either discrete components or special IC like a logic flip-flop etc. A flip-flop can, for instance, be made of two NPN transistors with cross-coupled resistor feedback from collectors to the base of the opposite transistor. The balance circuit can be made from two PNP transistors having common emitters coupled as a simple differential amplifier.

LIST OF REFERENCE SIGNS

PCF1 first PCF element
PFC2 second PFC element
IC1 first integrated circuit
IC2 second integrated circuit
SYNC synchronisation circuit
PD phase detector
GATE1 gate signal of a transistor of IC1
GATE2 gate signal of a transistor of IC2
ERROR AMPLIFIER1 error amplifier of IC1
ERROR AMPLIFIER2 error amplifier of IC2
LPF low-pass filter
BC balance circuit

The invention claimed is:

1. A system for operating a first PFC element and a second PFC element in an interleaved manner, said system comprising:
   a first integrated circuit having a first PFC controller;
   a second integrated circuit having a second PFC controller;
   a synchronization circuit connecting the first integrated circuit and the second integrated circuit, the synchronization circuit including a phase detector adapted to generate output signals in dependence on a phase relation between a signal provided by the first integrated circuit and a signal provided by the second integrated circuit, said output signals being sent to the first integrated circuit or to the second integrated circuit; and
   wherein the synchronization circuit is adapted to control the first integrated circuit and the second integrated circuit such that the first PFC element and the second PFC element are operated in anti-phase;
   wherein the phase detector is realized as a flip-flop, which is provided with a gate signal of a transistor of the first integrated circuit, as well as with a gate signal of a transistor of the second integrated circuit; and
   wherein a first output signal of the flip-flop is sent to an error amplifier of the first integrated circuit, and a second output signal of the flip-flop is sent to an error amplifier of the second integrated circuit.

2. The system according to claim 1, whereas said system is realized as a symmetric phase locked loop.

3. The system according to claim 2, whereas the synchronization circuit is adapted to use a signal provided by the first integrated circuit or a signal provided by the second integrated circuit as a master for the symmetric phase locked loop.

4. The system according to claim 3, whereas the synchronization circuit is adapted to control the signal provided by the first integrated circuit on the basis of its phase relation to the signal provided by the second integrated circuit, and vice versa.

5. The system according to claim 1, whereas the flip-flop is made of two NPN transistors with cross-coupled resistor feedback from collectors of one transistor to a base of the respective opposite transistor.

6. The system according to claim 1, whereas the output signals of the phase detector, including the first output signal and the second output signal of the flip-flop, are guided across a low-pass filter of the synchronization circuit.

7. The system according to claim 1, whereas the system further comprises a balance circuit adapted to match an output voltage of the error amplifier of the first integrated circuit with an output voltage of the error amplifier of the second integrated circuit.

8. The system according to claim 7, whereas the balance circuit is part of the synchronization circuit.

9. The system according to claim 7, whereas the balance circuit is made of two PNP transistors having common emitters coupled as a simple differential amplifier.

10. The system according to claim 1, whereas the first integrated circuit and the second integrated circuit are adapted to apply direct current control and each contains a voltage error amplifier.

11. The system according to claim 1, whereas the first integrated circuit and the second integrated circuit are adapted to apply indirect current control and each contains a transconductance amplifier as an error amplifier.

* * * * *